United States Patent

Nakasuji

(10) Patent No.: US 6,538,255 B1
(45) Date of Patent: Mar. 25, 2003

(54) ELECTRON GUN AND ELECTRON-BEAM OPTICAL SYSTEMS AND METHODS INCLUDING DETECTING AND ADJUSTING TRANSVERSE BEAM-INTENSITY PROFILE, AND DEVICE MANUFACTURING METHODS INCLUDING SAME

(75) Inventor: Mamoru Nakasuji, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/510,581

(22) Filed: Feb. 22, 2000

(30) Foreign Application Priority Data

Mar. 3, 1999 (JP) ............................. 11-054920
Feb. 22, 1999 (JP) ............................. 11-042879

(51) Int. Cl.⁷ ..................... H01J 37/065; H01J 37/317; H01J 37/244
(52) U.S. Cl. ............... 250/492.23; 250/492.2; 250/398; 250/397
(58) Field of Search .............. 250/492.2, 492.23, 250/492.3, 398, 397

(56) References Cited

U.S. PATENT DOCUMENTS 5,404,019 A * 4/1995 Ohno et al. ............ 250/492.23
5,821,542 A * 10/1998 Golladay ................ 250/492.2
5,932,884 A * 8/1999 Aizaki ................... 250/492.23
6,218,676 B1 * 4/2001 Nakasuji ................. 250/492.3

FOREIGN PATENT DOCUMENTS

| JP | 9-031415 | 1/1997 |
|----|----------|--------|
| JP | 10-172115 | 6/1998 |
| JP | 10-226583 | 7/1998 |

* cited by examiner

*Primary Examiner*—Jack Berman
(74) *Attorney, Agent, or Firm*—Klarquist Sparkman LLP

(57) ABSTRACT

Electron guns, and electron-beam optical systems including same, are disclosed that allow adjustment and attainment of a uniform transverse beam-intensity distribution in an electron beam. Such electron guns and systems are especially useful in electron-beam microlithography apparatus and methods. A representative electron gun includes a cathode having an electron-emitting surface, an anode for drawing electrons away from the cathode, and a filament array for applying electrical energy to a rear (upstream-facing) surface of the cathode. The filament array includes multiple independently controllable filaments.

35 Claims, 6 Drawing Sheets

ELECTRON GUN AND ELECTRON-BEAM OPTICAL SYSTEMS AND METHODS INCLUDING DETECTING AND ADJUSTING TRANSVERSE BEAM-INTENSITY PROFILE, AND DEVICE MANUFACTURING METHODS INCLUDING SAME

FIELD OF THE INVENTION

The invention pertains to electron guns as used in apparatus and methods utilizing an electron beam, especially apparatus and methods in which an electron beam is used to perform projection of an image of a pattern (such as an integrated circuit pattern), as defined on a reticle, to a sensitive substrate (such as a semiconductor wafer). The invention also pertains to apparatus including such guns and to methods for manufacturing devices (e.g., semiconductor integrated circuits), wherein the methods utilize such projection apparatus.

BACKGROUND OF THE INVENTION

A key technology in manufacturing integrated circuits and displays is microlithography (image-transfer and imprinting technology). Feature sizes and line widths of integrated circuits progressively are becoming more miniaturized and have now reached the resolution limit of light (visible and ultraviolet light as used in "optical" microlithography). Electron-beam microlithography currently is under intensive investigation as a possible successor to optical microlithography, especially in view of the potentially greater resolving power of electron-beam microlithography compared to optical microlithography.

In electron-beam microlithography, an electron beam is produced by an electron gun. The beam is directed to a reticle (sometimes termed a "mask") that defines the pattern to be transferred. The beam illuminates the pattern, or a selected portion thereof on the reticle, and the portion of the beam passing through the illuminated portion of the reticle is directed to a selected region of the substrate. More specifically, the electron beam propagating from the electron gun to the reticle is termed the "illumination beam," which passes through an "illumination-optical system" to the reticle. The illumination-optical system typically includes multiple electromagnetic lenses that converge the illumination beam appropriately for illuminating the desired region of the reticle. Upon passing through the reticle, the illumination beam acquires an ability to form an image of the illuminated portion of the reticle; thus, the beam propagating downstream of the reticle is termed the "patterned beam." The patterned beam passes through a "projection-optical system" to the substrate. The projection-optical system typically includes a pair of electromagnetic projection lenses that form a focused image, of the illuminated portion of the reticle, of a desired size on a corresponding region of the substrate. Hence, the image defined by the reticle is projected onto the substrate, usually portion-by-portion. This general process is also termed "pattern transfer" because the pattern defined by the reticle effectively is "transferred" to the substrate.

Conventional microlithography apparatus as summarized above normally produce a "demagnified" (or "reduced") image on the substrate. This means that the image as formed on the substrate is smaller, usually by an integer factor, than the corresponding illuminated region on the reticle. The reciprocal of the integer factor is termed the "demagnification ratio," of which a representative value is 1/4 or 1/5.

Electron guns used in conventional electron-beam microlithography apparatus of the type summarized above generally include three electrodes. The first electrode is a cathode used within a temperature-limitation region of its intensity-temperature (I-T) profile (FIG. 3). The second electrode is an anode that is charged appropriately to pull electrons away from the cathode to propagate through an axial aperture defined by the anode. The third electrode is a Wehnelt electrode (also termed a "Wehnelt cylinder") that serves, inter alia, to guide electrons from the cathode through the anode aperture and thus, by preventing impingement of the electrons on the anode, reduce heating of the anode. In this conventional electron-gun configuration, the cathode and Wehnelt electrode are insulated electrically from each other, and have different electrical potentials (voltages) applied to them.

Many types of conventional electron-beam microlithography systems (e.g., variable-shaped pattern systems, character-projection systems, and divided-pattern projection systems) utilize a "solid" electron beam having a transverse profile (e.g., gaussian or rectangular) in which the beam intensity at the contrast aperture is greatest at the center of the beam. However, it has been found that, in such systems, a solid beam is subject to "space-charge effects" that are manifest as, e.g., focal-point shift, increase in beam blur, and distortion of the pattern as projected onto a wafer or other suitable substrate. In effort to solve problems associated with space-charge effects, electron guns have been investigated that produce a "hollow beam" in which, at the contrast aperture, the most intense portion of the beam is not located at the center of the beam, but rather at peripheral regions of the beam.

Unfortunately, no effective methods or apparatus exist to date for evaluating or adjusting a hollow beam.

As shown in FIG. 3, within the temperature-limitation region of the cathodic I-T profile, even a slight change in cathode temperature causes a substantial change in the intensity of beam current produced by the cathode. Consequently, in an electron gun in which the cathode is operated under temperature-limitation conditions, any irregularity in cathode-surface temperature or irregularity in the work function of the cathode surface causes the intensity distribution of the electron beam to be not uniform. An electron beam produced under such conditions does not provide a desired uniform illumination of the reticle. As a result, the dimensional accuracy of the pattern as transferred onto the substrate is degraded. This problem is difficult especially whenever a hollow beam is used.

For example, in order for an electron-beam microlithography apparatus to be viable commercially for high-volume production, it must have a per-shot exposure area of at least 1 mm×1 mm at the reticle, which requires a cathodic surface having an area of 3 to 10 mm². Variations arising from the cathode being operated under temperature-limitation conditions can be substantial, especially with a gun having a cathode configured to produce a hollow beam.

SUMMARY OF THE INVENTION

In view of the shortcomings of the prior art as summarized above, an object of the present invention is to provide electron guns, for use in electron-beam microlithography apparatus that produce a demagnified image of the reticle pattern on the substrate, in which the transverse distribution of electron-beam intensity can be made uniform or otherwise adjusted as required.

To such end, and according to a first aspect of the invention, electron guns are provided that comprise a cathode, an anode, and a filament array. The cathode comprises an electron-emitting surface that emits a beam of electrons whenever the cathode is energized electrically. The anode is situated downstream of the cathode and can be energized at a voltage appropriate for drawing electrons from the cathode. The filament array is situated adjacent the cathode (e.g., adjacent an upstream-facing surface of the cathode) and is configured to energize respective regions of the cathode in a selective manner. The filament array comprises multiple filaments that are controllable independently to allow independent adjustment of electrical energy from the filaments to respective regions of the cathode.

Typically, the cathode and anode are arranged on an axis ("optical axis"), and the multiple filaments are arranged equidistantly from one another radially around the axis. For example, the filament array can comprise eight independently controllable filaments. In a particularly advantageous configuration, the electron-emitting surface is ring-shaped about the axis so as to emit a hollow beam of electrons, where each filament is adjacent a respective region of the ring-shaped electron-emitting surface.

The electron gun can include a control anode situated between the cathode and the anode. The electron gun also can include a Wehnelt electrode.

Each filament in the filament array is connected typically to a respective power supply and a respective bombardment-voltage power supply. The power supplies and bombardment-voltage power supplies are connected desirably to a CPU interface (or analogous controller) configured to energize the filaments and bombardment-voltage power supplies independently. For example, the filament array can be configured to bombard, when energized by the bombardment-voltage supplies, electrons onto an upstream-facing surface of the cathode. In such a configuration, each bombardment-voltage supply is controllable independently to allow independent adjustment of respective currents of electrons from the filaments bombarding the upstream-facing surface of the cathode.

The CPU interface can be connected to a computer or the like that is configured to receive and process data concerning a transverse beam-intensity profile of the electron beam and to route control signals to the bombardment-voltage power supplies as required to change the transverse beam-intensity profile of the electron beam. Alternatively or in addition, the CPU interface can be connected to a display. The display is configured to display data concerning a transverse beam-intensity profile of the electron beam. Such data can be used by an operator who inputs control commands to the CPU interface appropriate for causing the CPU interface to route control signals to the bombardment-voltage power supplies as required to change the transverse beam-intensity profile of the electron beam.

According to another aspect of the invention, electron-beam optical systems are provided, especially for use in an electron-beam microlithography apparatus. A representative embodiment of such a system comprises, on an optical axis, an electron gun, an illumination-optical system, and a projection-optical system.

The electron gun of the system comprises a cathode comprising an electron-emitting surface that emits an illumination beam of electrons whenever the cathode is energized electrically. The electron gun also comprises an anode situated downstream of the cathode. The anode can be energized at a voltage appropriate for drawing electrons from the cathode.

The electron gun can include a filament array situated adjacent the cathode and configured to energize respective regions of the cathode in a selective manner. The filament array comprises multiple filaments that are independently controllable to allow independent adjustment of electron current from the filaments to the respective regions of the cathode.

The illumination-optical system is situated downstream of the electron gun and is configured to direct the illumination beam to a region on a reticle situated downstream of the illumination-optical system. The region is illuminated by the illumination beam so as to produce a patterned beam propagating downstream of the reticle. The projection-optical system is situated downstream of the reticle and is configured to direct the patterned beam to a region on a substrate so as to imprint the substrate with a pattern defined on the reticle.

The system also comprises a first aperture situated off-axis, a first deflector, and a first detector. The first deflector is situated and configured to deflect, whenever the first deflector is energized, either the illumination beam or the patterned beam to the first aperture and to scan the beam relative to the first off-axis aperture. The first detector is situated relative to the first aperture and configured to obtain data concerning a transverse beam-intensity profile as the beam is scanned relative to the first off-axis aperture.

The first off-axis aperture and first deflector can be situated in the illumination-optical system in which the first deflector deflects and scans the illumination beam relative to the first aperture. A system having such a configuration also can comprise a second off-axis aperture, a second deflector, and a second detector. The second off-axis aperture is situated off-axis in the projection-optical system. The second deflector is situated in the projection-optical system and configured to deflect, whenever the second deflector is energized, the patterned beam to the second off-axis aperture and to scan the patterned beam relative to the second off-axis aperture. The second detector is situated relative to the second off-axis aperture and is configured to obtain data concerning a transverse beam-intensity profile as the patterned beam is scanned relative to the second off-axis aperture.

Alternatively, the first off-axis aperture, first deflector, and first detector can be situated in the projection-optical system. In such a configuration, the first deflector deflects and scans the patterned beam relative to the first off-axis aperture.

According to another aspect of the invention, methods are provided for detecting and adjusting a transverse beam-intensity profile of an electron beam produced in an electron-beam microlithography apparatus. (The apparatus includes, along an optical axis, an electron gun that produces an electron beam, an illumination-optical system that directs the electron beam to a reticle, and a projection-optical system that receives the electron beam from the reticle and directs the beam to a substrate.) In a representative embodiment of the method, the electron gun is provided with multiple filaments adjacent a cathode of the electron gun. Each filament is connected to a respective power supply and a respective bombardment-voltage supply, and each filament can be energized selectively to adjust an output of electrons from a respective region of the cathode. An off-axis aperture is provided on a plane at a position at which either the illumination-optical system or the projection-optical system forms an image of a beam crossover (e.g., gun crossover). A detector is situated downstream of the off-axis aperture and a deflector is situated upstream of the off-axis aperture. The deflector is energized to cause the deflector to deflect the electron beam laterally to the off-axis aperture. The electron beam is scanned across the off-axis aperture. Using the detector, electrons are detected that have passed through the off-axis aperture so as to produce a data signal corresponding to a transverse beam-intensity profile of the electron beam. Based on data in the data signal, electrical energy provided to at least some of the power supplies and bombardment-voltage supplies can be adjusted selectively as required to cause a change to the transverse beam-intensity profile.

The foregoing and additional features and advantages of the invention will be more readily apparent from the following detailed description, which proceeds with reference to the accompanying drawings.

DETAILED DESCRIPTION

Figure 1A:
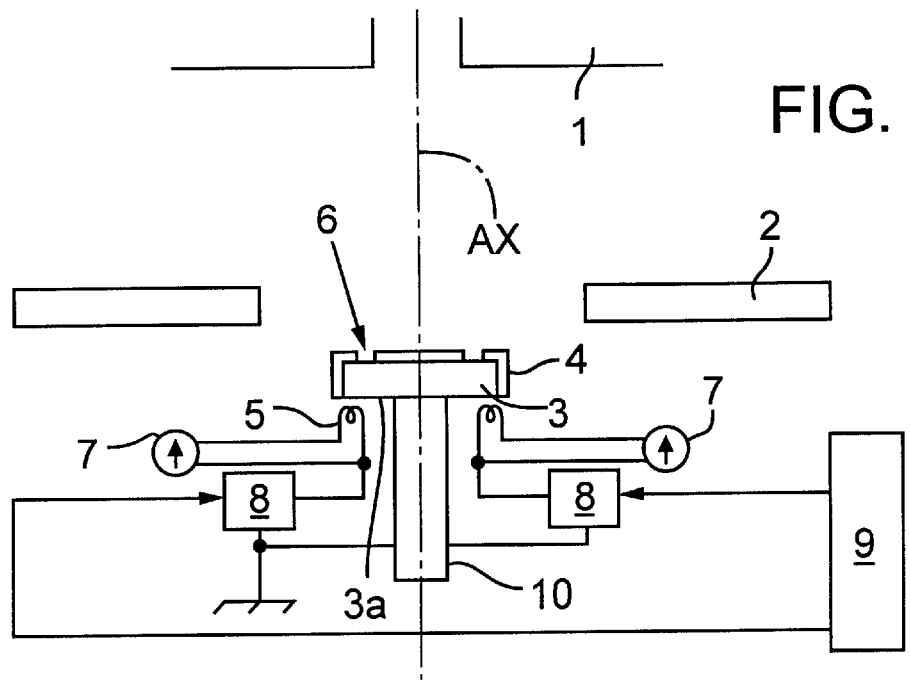
FIG. 1(a) is a simplified elevational view of an electron gun according to a representative embodiment of the invention.
Figure 1B:
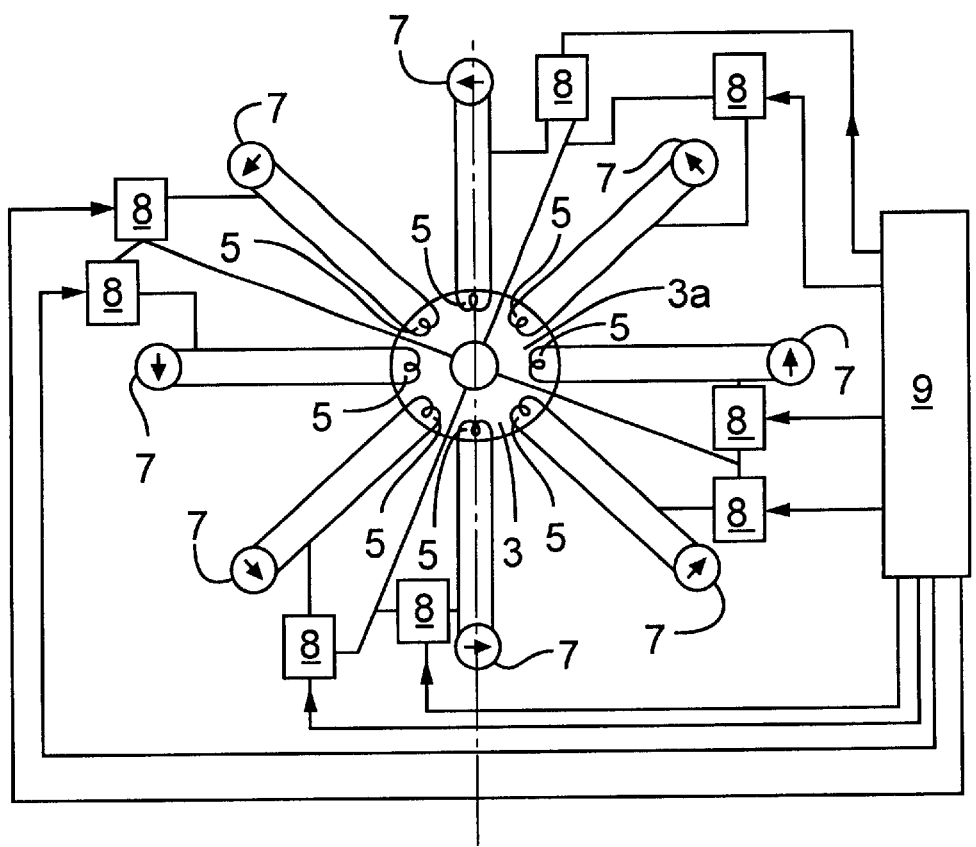
FIG. 1(b) is a simplified plan view of the FIG. 1(a) embodiment, showing detail of the upstream-facing surface of the cathode.

A representative embodiment of an electron gun according to the invention is described below with reference to FIGS. 1(a) and 1(b), showing an elevational view and a plan view, respectively. In FIG. 1(a), the downstream direction extends upward in the figure. The electron gun comprises an anode 1, a control anode 2, a cathode 3, and an array of sub-cathodic filaments 5 arranged along an "optical axis" AX. Although FIG. 1(a) does not show a Wehnelt electrode, it will be understood that a Wehnelt electrode can be, and desirably is, included with this embodiment.

The anode 1 desirably is configured as a plate defining an axial aperture (opening). The anode 1 normally is at ground (zero voltage) potential. The anode 1 serves to draw electrons away from the cathode 3, to which a negative voltage (acceleration voltage) is applied.

The control anode 2 desirably is configured as a plate defining an axial aperture (opening). The control anode 2 is situated, on the axis AX and parallel to the anode 1, between the cathode 3 and the anode 1.

The respective diameter and axial position of the aperture in the anode 1 and the aperture in the control anode 2 are optimized, by simulation, for high-emittance conditions with minimum generation of lens-effect aberrations.

The cathode 3 desirably is made of tantalum with a film 4 of iridium or rhenium selectively formed on the downstream-facing tantalum surface. By "selectively" is meant that the downstream-facing tantalum surface is covered with the film 4 except for an area of the tantalum surface defining a ring-shaped electron-emitting surface 6. By way of example, with a cathode 3 having a diameter of 10 mm, the iridium or rhenium film 4 is deposited (e.g., by vacuum deposition) within a cathode radius of 0 to 4 mm and also within the cathode radius of 4.5 to 5 mm. Thus, a "ring" 6 of bare tantalum is left exposed within the remaining cathode region between radii of 4 and 4.5 mm. Because electrons are emitted from this exposed tantalum ring 6, the ring 6 is also termed herein the "electron-emitting surface" 6.

The work functions of iridium and rhenium are 5.3 eV and 4.7 eV, respectively, while the work function of tantalum is 4.19 eV. Hence, iridium and rhenium have larger respective work functions than tantalum. For this reason, the temperature of the cathode 3 can be established such that an electron beam is emitted only from the electron-emitting surface 6.

Because the material of the film 4 is electrically conductive, the film is essentially at the same potential as the electron-emitting surface 6 on the cathode 3. Consequently, the film 4 does not perturb the electric field near the electron-emitting surface 6.

The cathode 3 is mounted centrally to a support member 10 made of an electrically conductive but thermally insulating material. Desirably, the support member 10 is made of ceramic with an electrically conductive metal coating. The metal coating is connected to ground.

In the FIG. 1(a) embodiment, eight filaments (also termed "sub-cathodes") 5 are placed adjacent the cathode 3, more specifically adjacent a rear (upstream-facing) surface 3a (underside in the drawing) of the cathode 3. As shown in FIG. 1(b), the filaments 5 are spaced evenly from each other in a radial pattern around the center of the cathode 3, "under" (i.e., upstream of) the ring-shaped electron-emitting surface 6. Each filament 5 is connected to a respective d.c. power supply 7 and a respective bombardment-voltage supply 8. The d.c., power supplies 7 simply heat the respective filaments 5. The bombardment-voltage supplies 8 provide a continuous respective d.c. voltage to the respective filaments 5 sufficient to keep the respective filaments at desired respective negative voltages. Electrons from the filaments 5 locally bombard the rear surface 3a of the cathode 3. Such bombardment causes localized heating of the electron-emitting surface 6. Each bombardment-voltage supply 8 is controllable independently by a central-processing-unit (CPU) interface 9 to which the bombardment-voltage supplies 8 are connected. The bombarding electrons are returned to the bombardment-voltage supplies 8 through the support member 10. Note that, by connecting the ground terminal of each bombardment-voltage supply 8 to the support member 10, the ground connections are common.

Thus, the cathode 3 is not heated directly by the filaments 5 but rather by bombardment of electrons produced by the filaments 5 and directed to respective regions of the cathode. At each respective region of the cathode, the current of bombarding electrons can be changed rapidly using the bombardment-voltage supplies, which allows rapid changes of localized cathode temperature in contrast to the slow changes of localized cathode temperature otherwise achievable using direct heating of the cathode.

FIG. 1(b) depicts a configuration in which eight filaments 5 are situated adjacent the rear surface 3a of the cathode 3 in an evenly spaced radial arrangement around the center of the cathode. However, the number and arrangement of the filaments 5 can be varied from the depicted configuration, depending upon the size of the cathode 3 and size and shape of the electrode-emitting surface 6.

Figure 2:
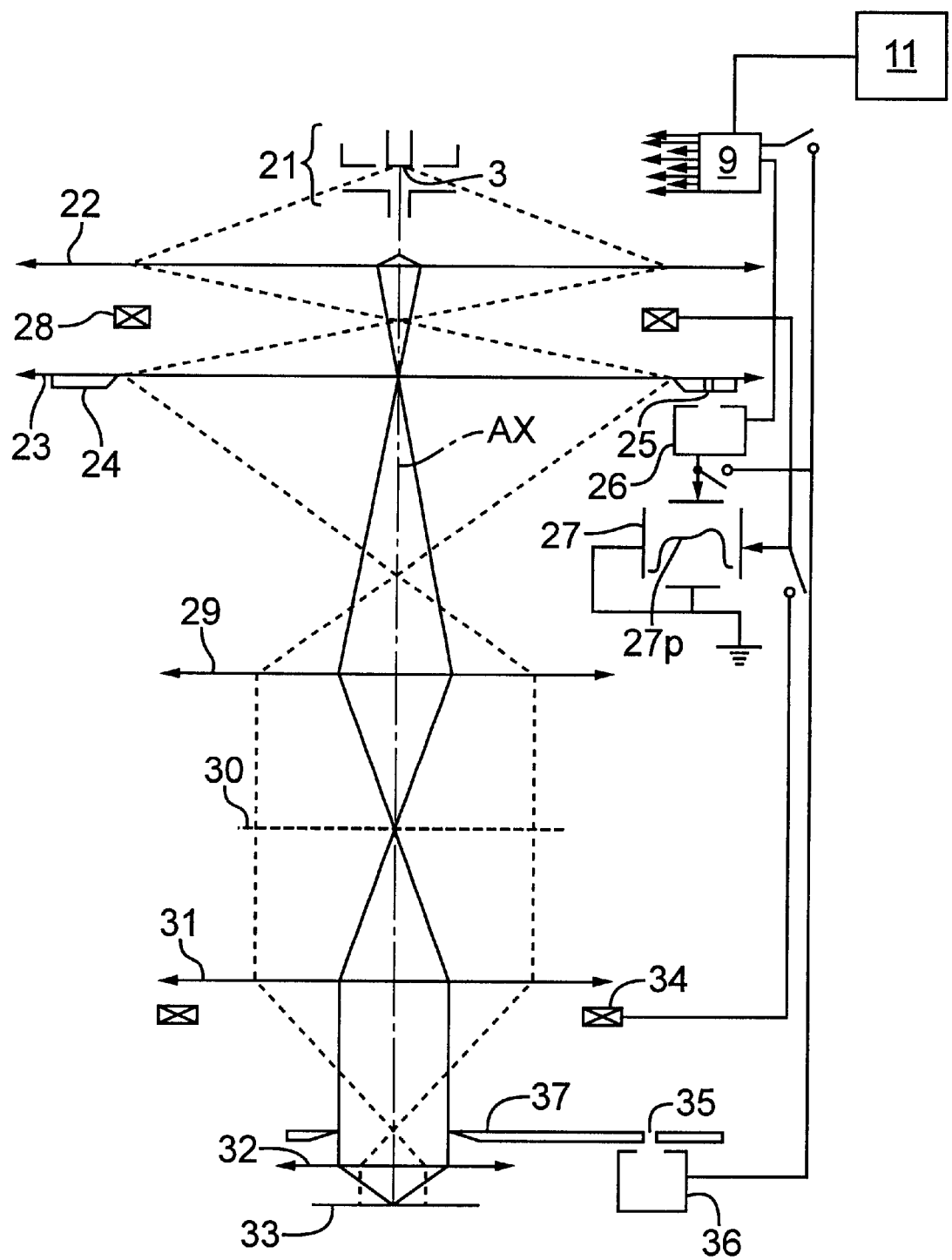
FIG. 2 is a schematic elevational depiction of a first representative embodiment of an electron-beam microlithography apparatus according to the invention that includes an electron gun of the type shown in FIGS. 1(a) and 1(b).
Figure 3:
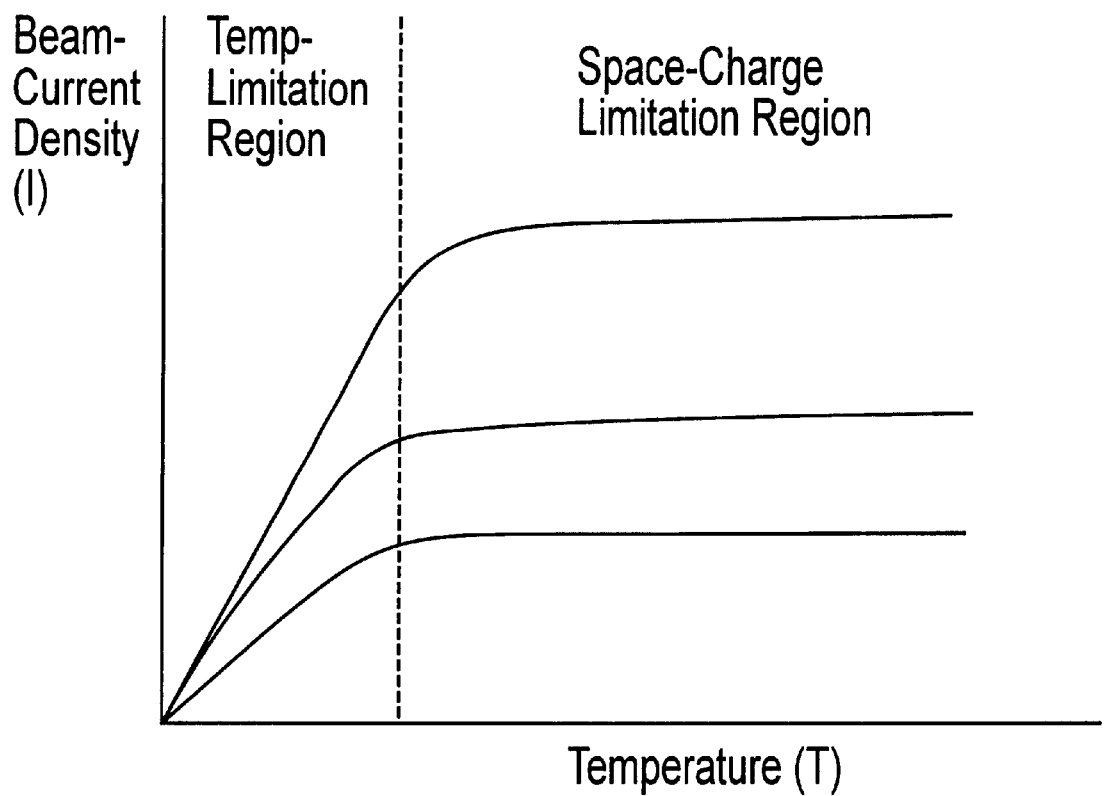
FIG. 3 is a graph of representative "I-T profiles," i.e., plots of the variation in beam-current density (quantity of emitted electrons in a particular region of the transverse profile of the beam) as a function of cathode temperature, in an electron gun having a prescribed potential difference between the cathode and anode of the gun.

A first representative embodiment of a method (and corresponding system), according to the invention, for controlling an electron gun 21 as used in a reduced-image-type of electron-beam microlithography apparatus, is now described with reference to FIG. 2. In FIG. 2, the dotted ray lines permit identification of axial locations that are conjugate to the surface of the cathode 3. The solid ray lines permit identification of axial locations that are conjugate to a flat portion of a transverse intensity distribution of the electron beam formed near a beam crossover but located downstream of the cathode.

The electron gun 21 emits an electron beam (termed an "illumination beam") in a downstream direction (downward in the drawing) along an optical axis AX. The illumination beam desirably is a hollow beam. The illumination beam is converged by a first condenser lens 22 and additionally converged by a second condenser lens 23. The illumination beam is shaped, by passage through a beam-shaping aperture 24, to have a transverse outer-edge profile (e.g., square) sufficient to illuminate a desired region on a reticle 30. The beam-shaping aperture 24 desirably is situated within the second condenser lens 23. The shaped illumination beam then passes through an illumination lens 29 to illuminate the desired region on the reticle 30. The "illumination-optical system" of the FIG. 2 embodiment comprises the condenser lenses 22, 23, the beam-shaping aperture 24, and the illumination lens 29.

The reticle 30 defines a pattern containing elements that differentially transmit and scatter electrons of the illumination beam. Thus, as the illumination beam passes through the illuminated portion of the reticle 30, the beam becomes a "patterned beam" having an ability to form a downstream image of the illuminated portion of the reticle.

The patterned beam propagates through a "projection-optical system" which, in the FIG. 2 embodiment, comprises a first projection lens 31, a second projection lens 32, and a contrast aperture 37. The projection-optical system forms the image, carried by the patterned beam, on the surface of a suitable substrate 33 (e.g., semiconductor wafer). Because the image formed on the substrate 33 is smaller than the corresponding illuminated region on the reticle 30, the projection-optical system "demagnifies" the image by a "demagnification ratio" (e.g., 1/4 or 1/5). Thus, a "reduced" or "demagnified" image of the reticle pattern is formed on the surface of the substrate 33. The upstream-facing surface of the substrate is coated with a resist that, when exposed by the patterned beam, becomes imprinted with the pattern.

The beam-shaping aperture 24 is configured essentially as an aperture plate that defines an axial opening through which the illumination beam passes. In the FIG. 2 embodiment, the aperture plate of the beam-shaping aperture 24 also defines a relatively small aperture (in this example, approximately 2 $\mu$m in diameter) situated off-axis. Thus, the off-axis aperture 25 in the figure is in the same plane as the beam-shaping aperture 24. (The off-axis aperture 25 alternatively can be placed at any plane that is optically conjugate with the beam-shaping aperture.) Situated downstream of the off-axis aperture 25 is a first detector 26 (desirably configured as a "Faraday cage" as known in the art) used for detecting electrons of the illumination beam passing through the off-axis aperture 25.

The contrast aperture 37 is located axially where an image of the cathode is formed between the first and second projection lenses 31, 32. Such a location in this embodiment is also where the entrance pupil of the projection lenses 31, 32, regarded collectively, is located. The contrast aperture 37 is configured essentially as an aperture plate that defines an axial opening through which the patterned beam passes. In the FIG. 2 embodiment, the aperture plate of the contrast aperture 37 also defines a relatively small aperture 35 (in this example, approximately 2 $\mu$m in diameter) situated off-axis. Thus, the off-axis aperture 35 is in the same plane as the contrast aperture 37. Situated downstream of the off-axis aperture 35 is a second detector 36 (desirably configured as a "Faraday cage") used for detecting electrons that pass through the off-axis aperture 35.

The off-axis aperture 35 (with downstream detector 36) alternatively can be located on a plane where an image of the cathode is formed between the first condenser lens 22 and the illumination lens 29. This alternative location is optically conjugate to the location shown in FIG. 2.

FIG. 2 also depicts the CPU interface 9, discussed above, to which the bombardment-voltage supplies are connected (see FIG. 1(b)). The CPU interface 9 is also connected to each detector 26, 36, to a display 27 (e.g., a cathode-ray tube, or "CRT"), and to a computer 11. A first deflector 28 located upstream of the beam-shaping aperture 24 and a second deflector 34 located upstream of the contrast aperture 34 are also connected to the display 27. The switch in the line connecting the deflectors 28, 34 together is used to change the source of the displayed intensity distribution in a selective manner, i.e., to select the source as being the beam-shaping aperture or the contrast aperture. The switch in the line connecting the second deflector 36 to the display 27 is used to select the intensity distribution at the contrast aperture that can be seen by the operator.

During operation of the FIG. 2 embodiment, a "coarse" beam-uniformity adjustment can be performed. To such end, as the electron beam is propagating downstream from the electron gun 21, the deflector 34 is energized to deflect the beam laterally to the off-axis aperture 35. As the beam is being deflected in such a manner, the beam is scanned over the off-axis aperture 35 in the X- and Y-directions (in the figure, horizontally and along a line perpendicular to the plane of the page of the drawing). As the off-axis aperture 35 is being scanned, signals representative of the amount of deflection imparted to the beam by the second deflector 34, and the electron intensity as detected by the second detector 36, are routed to the display 27. From the amount of deflection can be determined the portion of the beam diameter (beam transverse section) that is passing through the off-axis aperture 35. The display 27 displays a plotted representation 27p of electron intensity (on the vertical axis) versus position along the diameter of the beam (on the horizontal axis).

The switch in the line connecting the second detector 36 to the CPU interface 9 is used to select whether the display 27 is being used in a "manual" mode or in an automatic-control mode as controlled by the CPU interface 9.

The electron-intensity distribution as displayed on the display 27 can be observed (such as by a human operator) who can enter appropriate commands via the computer 11 connected to the CPU interface 9. Exemplary commands would include a specification of which filaments 5 require voltage adjustment and control, and a determination of appropriate values of bombardment voltage to be provided by the respective supplies 8. Such commands achieve appropriate adjustment of the filaments 5 to achieve an optimal distribution of beam intensity.

Since the portion of the beam scanned for making the "coarse" adjustment is at a location, along the optical axis AX, where an image of the cathode is formed, the displayed intensity distribution at such a point would be expected to have a two-peak curve profile representative of a ring-shaped beam.

The degree of rotation of the beam achieved by each of the various lenses in the FIG. 2 embodiment desirably is computed in advance. The data from such computations allow the degree of rotation of the electron beam emitted from the electron-emitting surface 6 to be taken into account when determining, based on the electron-intensity distribution on the display 27, the particular filaments 5 requiring voltage control. From the CPU interface 9, commands from the computer 11 are routed as voltage-control signals to the appropriate bombardment-voltage supply(ies) 8. These calculations can be repeated as required to obtain a desired or prescribed transverse intensity profile of the beam.

After a particular "coarse" intensity profile of the beam is obtained, fine adjustments of the beam can be performed as required. To perform a "fine" adjustment, the first deflector 28 is energized to scan the beam in the X- and Y-directions over the first off-axis aperture 25. Data obtained from such scanning are used to determine the particular filaments 5 requiring further adjustment of energizing voltage, in a manner similar to the "coarse" adjustment described above. The "fine" adjustment can be repeated as required to obtain a desired or prescribed electron-intensity distribution.

By way of example, if the electron intensity is low on the left and high on the right, as indicated by the profile 27p on the display 27 shown in FIG. 2, then the location on the cathode corresponding to the left side as detected (taking into account the degree of beam rotation) has a lower temperature than a location on the cathode corresponding to the right side as detected. (A region of the cathode at a lower temperature produces relatively fewer emitted electrons.)

Generally, it is sufficient to perform an adjustment of the electron gun 21, as described above, only after replacing the electron gun in a particular microlithography apparatus. However, it is possible for an electron gun to exhibit unstable performance, under which condition the electron gun desirably is adjusted more frequently, such as every time a new reticle is used.

Instead of having a technician observe the transverse intensity profile 27p as shown on the display 27 and manually enter corresponding data to the computer 11, it is possible for the computer 11 directly to process data routed to the display. In the latter instance, the results of such data processing can be used directly, without human intervention, to control the output from the cathode 3.

As described above, an electron gun 21 according to the present invention desirably comprises multiple independently voltage-controllable filaments 5 situated and arranged adjacent the cathode 3. The respective voltages supplied to the filaments 5 can be controlled individually so as to make adjustments to the transverse intensity of the electron beam. Such adjustments can yield a more uniform intensity profile, which yields a more accurate pattern transfer by the microlithography apparatus.

Because the filaments 5 desirably are situated adjacent the upstream-facing surface of the cathode 3, and desirably are arranged in an equally spaced radial pattern around the center (axis) of the cathode, the uniformity of the electron-beam intensity can be controlled with high accuracy.

In addition, because a ring-shaped beam thus can be emitted from the electron-emitting surface 6, the influence of space-charge effects on the reticle image can be reduced.

Figure 4:
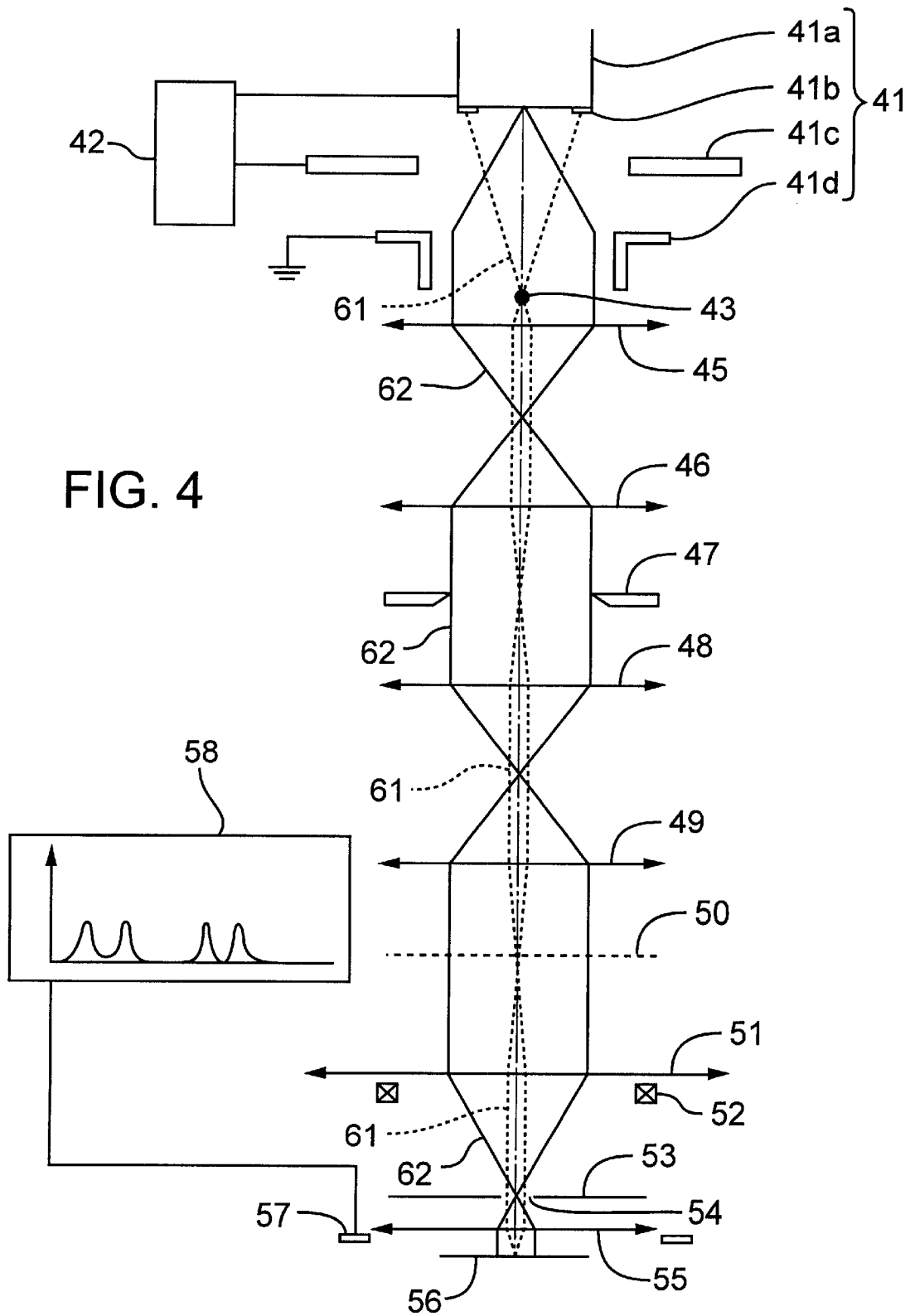
FIG. 4 is a schematic elevational depiction of a second representative embodiment of an electron-beam microlithography apparatus according to the invention.

FIG. 4 depicts a second representative embodiment of a method and system according to the invention. An electron gun 41 is situated at the upstream end of the system shown in FIG. 4 and emits a beam of electrons in a downstream direction (downward in the figure). The electron gun 41 comprises three electrodes: a cathode 41a, a control anode 41c, and an anode 41d. The cathode 41a has a ring-shaped electron-emitting surface 41b. The ring-shaped electron-emitting surface 41b can be formed using a material having a relatively low work function, with surrounding and central regions of the cathode 41a being formed of a material having a relatively high work function.

The anode 41d defines a respective aperture through which electrons from the cathode 41a can pass. The control anode 41c, located between the cathode and the anode, defines a respective aperture through which electrons from the cathode 41a can pass. The cathode, control anode, and anode are connected to a power supply 42 supplying respective potentials to these electrodes. By way of example, the cathode 41a is energized with −100 KV, the anode 41d has a ground potential, and the control anode 41c is energized at −82 KV.

The electron beam (illumination beam) emitted from the cathode 41a of the FIG. 4 embodiment is hollow at the cathode and its conjugate plane(s), with a ring-shaped transverse profile. The illumination beam forms a "gun cross-over" downstream of the cathode 41a. I.e., electrons emitted from the electron-emitting surface 41b converge at an axial region, denoted by the numeral 43, at which the beam has its most uniform intensity distribution.

From the electron gun 41 to the reticle 50, the illumination beam passes through an illumination-optical system including first and second condenser lenses 45, 46, respectively, and first and second illumination lenses 48, 49, respectively. A beam-shaping aperture 47 is situated between the second condenser lens 46 and the first illumination lens 48. The beam-shaping aperture 47 has a function as described with respect to the FIG. 2 embodiment, serving generally to trim the outside edge of the transverse profile of the illumination beam. At the beam-shaping aperture 47, the illumination beam is not hollow but rather has an even distribution (due to the imaging at the beam-shaping aperture 47 of the location 43). The first and second illumination lenses 48, 49 collectively form an image of the beam-shaping aperture 47 on the reticle 50. The image of the beam-shaping aperture 47 is formed on a region of the reticle 50 termed an "exposure unit" or "subfield."

Downstream of the beam-shaping aperture 47 is one or more deflectors (not shown) used for selectively deflecting the illumination beam to a desired subfield on the reticle 50 and for sequentially scanning the illumination beam, in a horizontal direction, to illuminate sequentially all the subfields within an optical field of the deflectors.

The reticle 50 and substrate ("wafer") 56 are mounted on respective stages (not shown) that facilitate the sequential exposure of subfields on the reticle.

Downstream of the reticle 50 are first and second projection lenses 51, 55, respectively (collectively defining a two-stage projection-lens system), a contrast aperture 54 (defined by a contrast-aperture plate), and deflectors (not shown). In the figure, one subfield of the reticle 50 is being illuminated by the illumination beam. Electrons of the illumination beam passing through the reticle 50 form a "patterned beam" that is reduced (demagnified) and converged as appropriate by the projection lenses 51, 55 for producing an image of the illuminated subfield on the wafer 56. The location of the image on the wafer 56 can be adjusted as required by the deflectors (not shown). The wafer 56 is coated with an appropriate resist so as to be imprinted with the reticle images upon receiving a proper dose of electrons from the patterned beam.

The contrast aperture 54 is situated at a position at which the axial distance from the reticle 50 to the wafer 56 is divided by the "demagnification ratio" of the projection lenses 51, 55. The contrast aperture 54 is situated on a plane that is optically conjugate with the electron-emitting plane of the cathode 41a. (In FIG. 4, the position of the contrast aperture 54 is the entrance pupil of the two-stage projection lens formed by the first and second projection lenses 51, 55.) The contrast-aperture plate is used to block electrons, scattered by the reticle 50 but lacking any image-forming information, from propagating to the wafer 56.

The contrast-aperture plate also defines a small off-axis aperture 53 used for beam adjustment, as described later.

Downstream of the first projection lens 51 is a deflector 52 used to scan the patterned beam over the off-axis aperture 53 for adjusting the beam.

Downstream of the second projection lens 55 but upstream of the wafer 56 is a secondary-electron detector 57. The detector 57 captures secondary electrons emitted from the wafer 56 and detects them. During beam adjustment, the detector 57 is also used to detect electrons passing through the off-axis aperture 53 defined by the contrast-aperture plate. The detector 57 is connected to a display 58 that, upon receiving a corresponding electrical signal from the detector 57, processes the signal to produce a displayed profile of the beam-intensity distribution. This signal can be processed synchronously with energizations of the deflector 52.

In FIG. 4, the ray trace indicated by the dotted lines denotes regions in which imaging has uniform transverse beam intensity and allows identification of regions that are optically conjugate to the axial location 43. The solid-line trace allows identification of regions that are optically conjugate to the plane of the electron-emitting surface of the cathode 41a. As shown in the figure, the cathode 41 a and contrast aperture 54 are conjugate. Also conjugate are the axial location 43 of uniform beam intensity, the beam-shaping aperture 47, the reticle 50, and the wafer 56.

Figure 5:
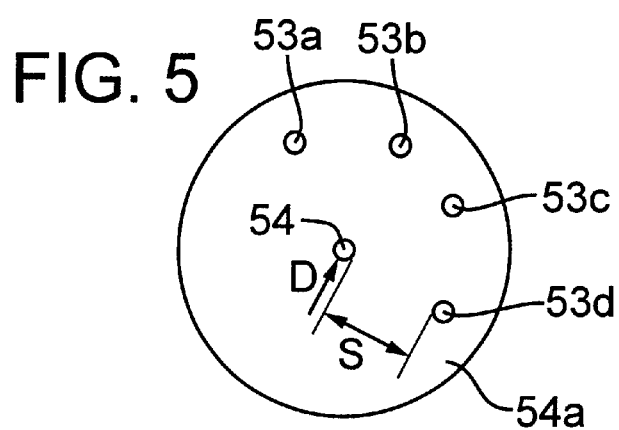
FIG. 5 is a plan view of the aperture plate of the contrast aperture as used in the FIG. 4 embodiment.

FIG. 5 is a plan view of a representative embodiment of a contrast-aperture plate 54a that defines the contrast aperture 54 used in the FIG. 4 embodiment. The actual contrast aperture 54 is circular and located in the center of the plate 54a. The contrast aperture 54 has a diameter "D" that is desirably 1.2 to 1.3 times the diameter (e.g., 1 mm) of the electron beam at the axial position of the contrast aperture. The diameter of the aperture plate 54a is about 20D. The aperture plate 54a also defines multiple off-axis apertures 53a–53d. By way of example, each off-axis aperture 53a–53d is about 0.1 mm in diameter, and situated apart from the contrast aperture 54 by a distance "S", wherein S is 5D to 10D. Since the contrast aperture 54 is conjugate with the electron-emitting surface 41b of the cathode, the beam at the contrast aperture 54 is a hollow beam. The beam, even though hollow, can be evaluated using the off-axis apertures 53a–53d. To such end, the beam is scanned over an off-axis aperture 53a–53d. Electrons of the beam passing through an off-axis aperture 53 are detected using the secondary-electron detector 57. The apertures 53a and 53b are used for calibrating deflection sensitivity of X-direction deflection, and the apertures 53b and 53d are used for calibrating deflection sensitivity of Y-direction deflection.

Even though the beam produced by the FIG. 4 embodiment is a hollow beam, any of various situations can cause the beam not to have an ideal hollow profile. Such situations include, but are not limited to, lens aberrations, focus shifts, and a non-uniform emission of electrons from the electron-emitting surface 41b of the cathode (see discussion above regarding the embodiment of FIGS. 1(a)–(b) and 2). A procedure as described below can be followed to ascertain whether the hollow beam has a desired transverse profile.

Figure 6:
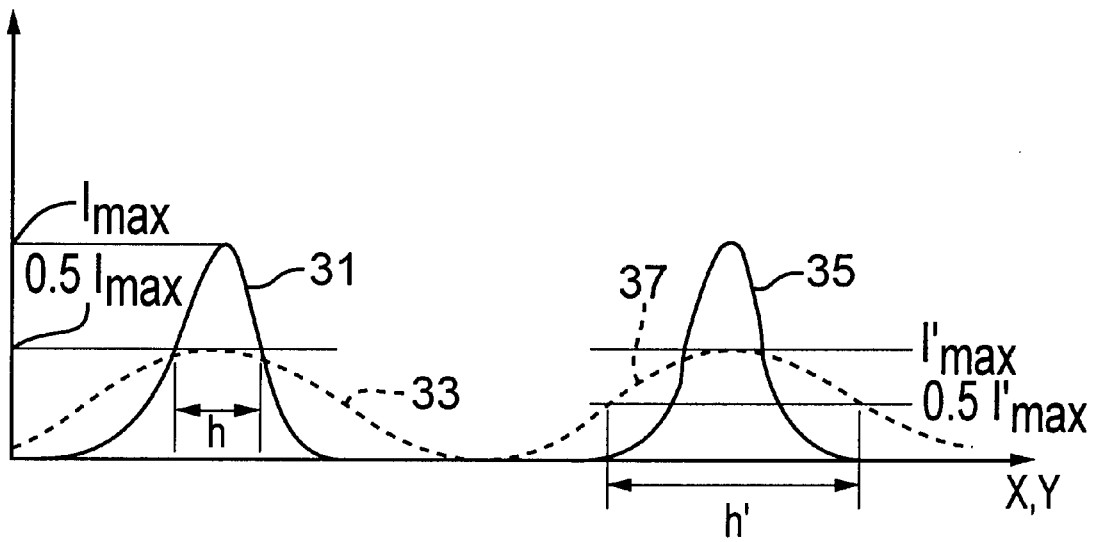
FIG. 6 is a graph of beam-intensity distributions as measured by scanning the beam in the X- and Y-directions over a small off-axis aperture defined by the contrast-aperture plate of the FIG. 4 embodiment. The abscissa is scanned beam position in the X- or Y-direction, and the ordinate is beam intensity.

FIG. 6 is a representative graph of transverse beam intensity as measured when scanning the beam in the X- or Y-direction across an off-axis aperture 53 in the contrast aperture plate 54a. The abscissa is the position in the X- or Y-direction, and the ordinate is beam intensity. Two peaks 31, 35 (solid-line curves) and the two peaks 33, 37 (dashed-line curves) are shown. Each set of curves 31, 35 and 33, 37 is of beam intensity measured as the beam is scanned over an off-axis aperture 53.

The curves 31, 35 exhibit steep peaks, indicating that the hollow beam exhibits a desirable minimal blur. In contrast, the curves 33, 37 exhibit shallow peaks, indicating an excessively blurred beam. With respect to the solid-line curves 31, 35, $I_{max}/h$ is an expression of peak sharpness, wherein $I_{max}$ is the peak height, and h is the full width at half maximum ($0.5)(I_{max})$ serving as an approximate measure of the "hollow width" (outside radius minus inside radius) of the hollow beam. With respect to the dashed-line curves 33, 37, $I_{max}'$ and h' have similar respective meanings. As can be seen readily, $I_{max}$ is high and h is small, whereas $I_{max}'$ is low and h' is large. When obtaining a transverse intensity profile of the beam, if curves such as 33, 37 are obtained, the profile can be adjusted by, for example, changing the voltage applied to the control anode 41c of the electron gun 41 to change the axial position of an image of the cathode without changing the real position of the cathode. Alternatively, the excitation current applied to one or both of the condenser lenses 45, 46 can be changed as required to form the cathode image exactly at the contrast aperture 54. The transverse profile of the hollow beam is optimized when $I_{max}/h$ is maximized.

Figure 7:
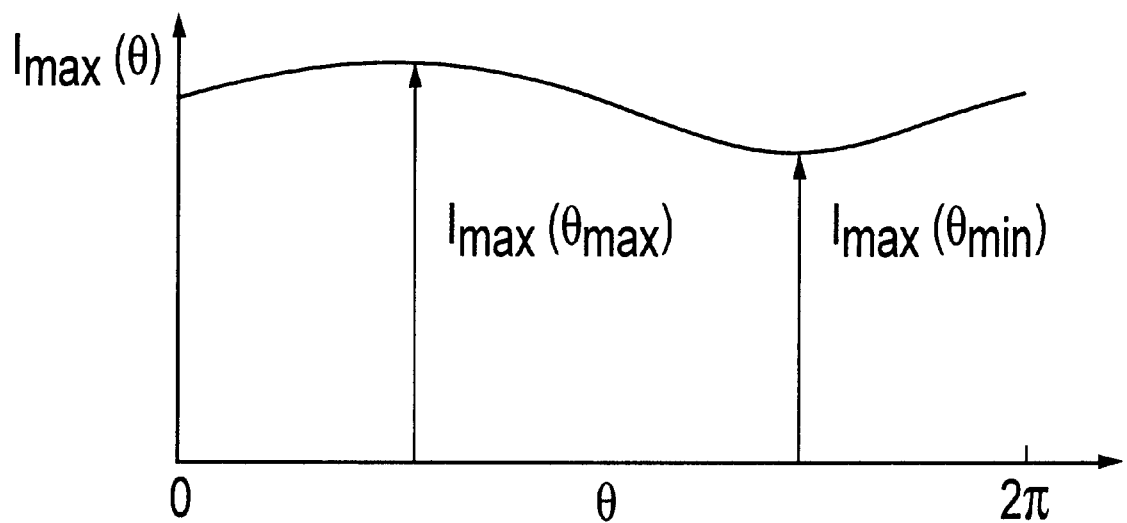
FIG. 7 is a graph of the beam-intensity distribution as measured by scanning the beam circularly over the small off-axis aperture defined by the contrast-aperture plate of the FIG. 4 embodiment. The abscissa is rotational angle θ and the ordinate is maximum beam intensity as a function of θ (i.e., the ordinate is $I_{max}(\theta)$). $I_{max}$ is as shown in FIG. 6, and $\theta_{max}$ and $\theta_{min}$ represent angles of circular beam scanning in which $I_{max}$ has a maximum value and a minimum value, respectively.

FIG. 7 depicts a graph of the distribution of beam intensity whenever the beam is scanned over an off-axis aperture (e.g., aperture 53) while circularly scanning the beam. The abscissa is the rotational angle (θ) of circular scanning, and the ordinate is the peak beam intensity as a function of θ, i.e., $I_{max}(\theta)$. In FIG. 7, $I_{max}$ varies markedly, and the difference between $I_{max}(\theta_{max})$ and $I_{max}(\theta_{min})$ is fairly large. It is desired that the ratio of $I_{max}(\theta_{max})$ to $I_{max}(\theta_{min})$ be minimal (i.e., unity or nearly unity). A large value of this ratio can arise from any of various causes such as the condition of the electron gun (e.g., whether the electron-emission surface has a uniform temperature, see above). If temperature of the cathode is not uniform, it can be adjusted as discussed above with respect to FIGS. 1(a)–1(b).

Figure 8:
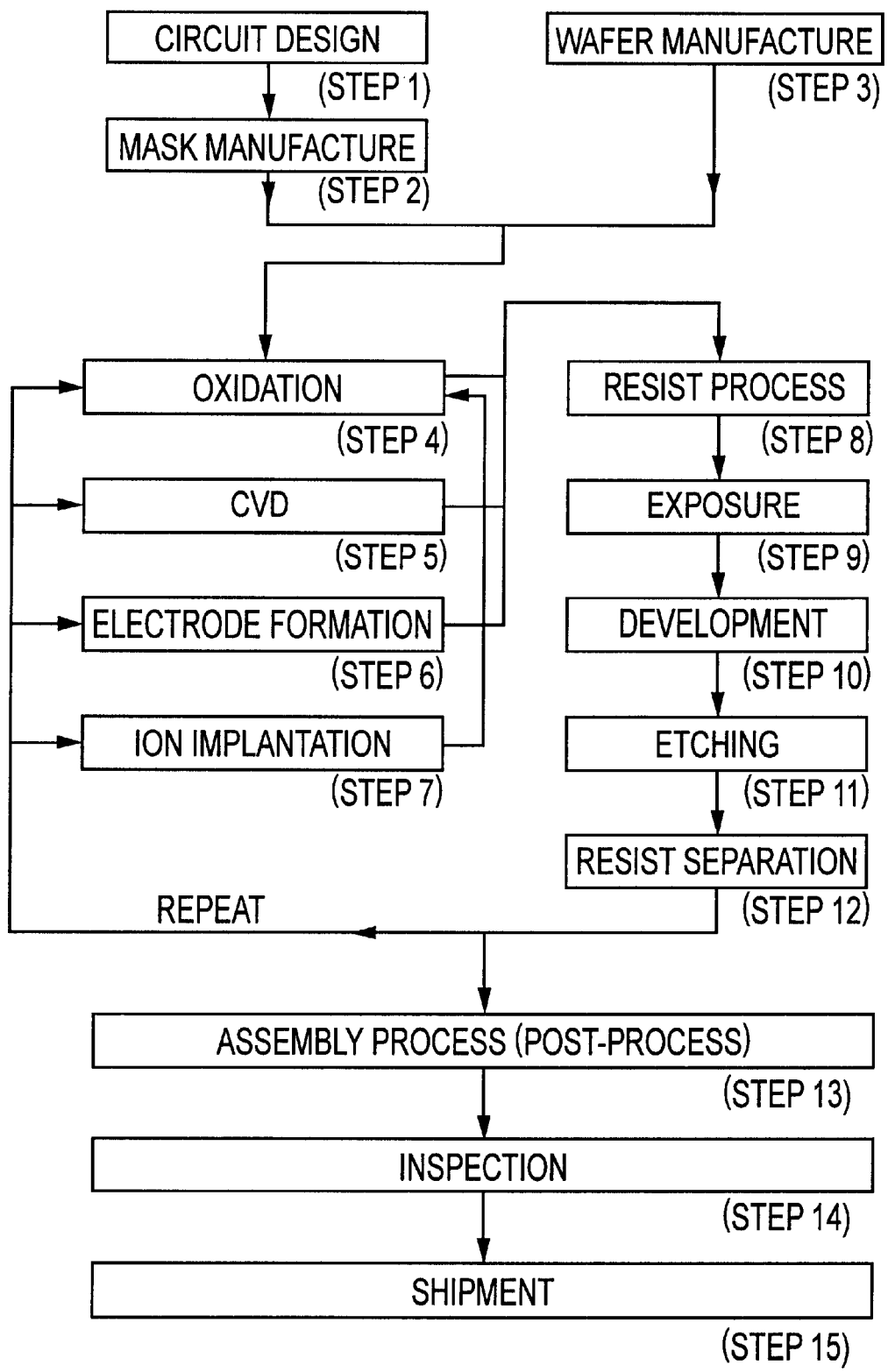
FIG. 8 is a flow chart of steps in a process for manufacturing a semiconductor device such as a semiconductor chip.

FIG. 8 is a flow chart of steps in a process for manufacturing a semiconductor device such as a semiconductor chip (e.g., an integrated circuit or LSI device), a display panel (e.g., liquid-crystal panel), or CCD, for example. In step 1, the circuit for the device is designed. In step 2, a reticle ("mask") for the circuit is manufactured. In step 3, a wafer is manufactured from a material such as silicon.

Steps 4–12 are directed to wafer-processing steps, specifically "pre-process" steps. In the pre-process steps, the circuit pattern defined on the reticle is transferred onto the wafer by microlithography. Step 13 is an assembly step (also termed a "post-process" step) in which the wafer that has been passed through steps 4–12 is formed into semiconductor chips. This step can include, e.g., assembling the devices (dicing and bonding) and packaging (encapsulation of individual chips). Step 14 is an inspection step in which any of various operability and qualification tests of the device produced in step 13 are conducted. Afterward, devices that successfully pass step 14 are finished, packaged, and shipped (step 16).

Steps 4–12 also provide representative details of wafer processing. Step 4 is an oxidation step for oxidizing the surface of a wafer. Step 5 involves chemical vapor deposition (CVD) for forming an insulating film on the wafer surface. Step 6 is an electrode-forming step for forming electrodes on the wafer (typically by vapor deposition). Step 7 is an ion-implantation step for implanting ions (e.g., dopant ions) into the wafer. Step 8 involves application of a resist (exposure-sensitive material) to the wafer. Step 9 involves microlithographically exposing the resist so as to imprint the resist with the reticle pattern, as described elsewhere herein. Step 10 involves developing the exposed resist on the wafer. Step 11 involves etching the wafer to remove material from areas where developed resist is absent. Step 12 involves resist separation, in which remaining resist on the wafer is removed after the etching step. By repeating steps 4–12 as required, circuit patterns as defined by successive reticles are formed superposedly on the wafer.

Whereas the invention has been described in connection with representative embodiments, it will be understood that the invention is not limited to those embodiments. On the contrary, the invention is intended to encompass all modifications, alternatives, and equivalents as may be included within the spirit and scope of the invention, as defined by the appended claims.

What is claimed is:

1. An electron gun, comprising:
   a cathode comprising an electron-emitting surface that emits a beam of electrons whenever the cathode is energized electrically;
   an anode situated downstream of the cathode, the anode being energizable at a voltage appropriate for drawing electrons from the cathode; and
   a filament array situated adjacent the cathode and configured to selectively energize the cathode, the filament array comprising multiple filaments that are independently controllable to allow independent adjustment of electron current propagating from the respective filaments to respective regions of the cathode.

2. The electron gun of claim 1, wherein:
   the cathode and anode are arranged on an axis; and
   the multiple filaments are arranged equidistantly from one another radially around the axis.

3. The electron gun of claim 2, wherein the filament array comprises no more than eight independently controllable filaments.

4. The electron gun of claim 2, wherein the electron-emitting surface is ring-shaped about the axis so as to emit a hollow beam of electrons.

5. The electron gun of claim 1, wherein:
   the cathode and anode are arranged on an axis; and
   the electron-emitting surface is ring-shaped about the axis so as to emit a hollow beam of electrons.

6. The electron gun of claim 1, further comprising a control anode situated between the cathode and the anode.

7. The electron gun of claim 1, wherein:
   each filament is connected to a respective power supply and a respective bombardment-voltage power supply; and
   the power supplies or bombardment-voltage power supplies are connected to a CPU interface configured to energize independently the filaments and bombardment-voltage power supplies.

8. The electron gun of claim 7, wherein:
   the CPU interface is connected to a computer; and
   the computer is configured to receive and process data concerning a transverse beam-intensity profile of the electron beam and to route control signals to the bombardment-voltage power supplies as required to change the transverse beam-intensity profile of the electron beam.

9. The electron gun of claim 7, wherein:
   the CPU interface is connected to a display; and
   the display is configured to display data concerning a transverse beam-intensity profile of the electron beam, the data being used by an operator who inputs control commands to the CPU interface appropriate for causing the CPU interface to route control signals to the bombardment-voltage power supplies as required to change the transverse beam-intensity profile of the electron beam.

10. The electron gun of claim 7, wherein:
    the filament array is configured to bombard, when energized by the bombardment-voltage supplies, electrons onto the cathode; and
    each bombardment-voltage supply is independently controllable to allow independent adjustment of respective currents of electrons from the filaments bombarding the respective regions of the cathode.

11. The electron gun of claim 1, wherein:
    the cathode comprises a downstream-facing surface and an upstream-facing surface;
    the downstream-facing surface comprises the electron-emitting surface; and
    the filament array is situated so as to energize respective regions of the upstream-facing surface in a selective manner with a respective electron current from a respective filament of the array.

12. An electron-beam optical system, comprising the electron gun of claim 1.

13. An electron-beam optical system for use in an electron-beam microlithography apparatus, the optical system comprising on an optical axis:
    an electron gun comprising (i) a cathode comprising an electron-emitting surface that emits an illumination beam of electrons whenever the cathode is energized electrically; and (ii) an anode situated downstream of the cathode, the anode being energizable at a voltage appropriate for drawing electrons from the cathode;
    an illumination-optical system situated downstream of the electron gun and being configured to direct the illumination beam to a region on a reticle situated downstream of the illumination-optical system, the region being illuminated by the illumination beam so as to produce a patterned beam propagating downstream of the reticle;

a projection-optical system situated downstream of the reticle and being configured to direct the patterned beam to a region on a substrate so as to imprint the substrate with a pattern defined on the reticle;

a first aperture situated off-axis;

a first deflector situated and configured to deflect, when appropriately energized, an electron beam to the first aperture and to scan the beam relative to the first aperture, the electron beam carrying an image of the cathode; and a first detector situated relative to the first aperture and configured to obtain data concerning a transverse beam-intensity profile as the electron beam is scanned relative to the first aperture.

14. The system of claim 13, wherein the first aperture and first deflector are situated at a beam-shaping aperture or at a position that is optically conjugate to the beam-shaping aperture.

15. The system of claim 14, further comprising:

a second aperture situated off-axis at a location where an image of the cathode can be formed or at a location optically conjugate to the location;

a second deflector situated and configured to deflect, when appropriately energized, the patterned beam to the second aperture and to scan the patterned beam relative to the second aperture; and a second detector situated relative to the second aperture and configured to obtain data concerning a transverse beam-intensity profile as the patterned beam is scanned relative to the second aperture.

16. The system of claim 13, further comprising a filament array situated adjacent the cathode and configured to energize the cathode in a selective manner, the filament array comprising multiple filaments that are independently controllable to allow independent adjustment of electron current from the filaments to respective regions of the cathode.

17. The system of claim 16, wherein:

each filament is connected to a respective power supply and a respective bombardment-voltage power supply;

the power supplies and bombardment-voltage power supplies are connected to a CPU interface configured to energize independently the filaments or bombardment-voltage power supplies; and the first detector is connected to the CPU interface so as to provide data to the CPU regarding a transverse beam-intensity profile of the beam, the CPU utilizing such data in energizing independently the filaments and bombardment-voltage supplies so as to achieve a change in the transverse beam-intensity profile.

18. An electron-beam microlithography apparatus, comprising the electron-beam optical system of claim 13.

19. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) removing the resist; and step (ii) comprises providing an electron-beam microlithography system as recited in claim 18; and using the electron-beam microlithography system to expose the resist with the pattern defined on the reticle.

20. A semiconductor device produced by the method of claim 19.

21. An electron-beam optical system, comprising:

an electron gun comprising a cathode comprising a ring-shaped electron-emitting surface that produces a hollow illumination beam of electrons whenever the cathode is energized electrically, and an anode situated downstream of the cathode, the anode being energizable at a voltage appropriate for drawing electrons from the cathode;

an illumination-optical system situated downstream of the electron gun and being configured to direct the illumination beam to a region on a reticle situated downstream of the illumination-optical system, the region being illuminated by the illumination beam so as to produce a patterned beam propagating downstream of the reticle;

a projection-optical system situated downstream of the reticle and being configured to direct the patterned beam to a region on a substrate so as to imprint the substrate with a pattern defined on the reticle;

a first aperture situated off-axis at a location conjugate to the cathode;

a first deflector situated and configured to deflect, when appropriately energized, an electron beam to the first aperture and to scan the beam relative to the first aperture, the electron beam carrying an image of the cathode; and a first detector situated relative to the first aperture and configured to obtain data concerning a transverse beam-intensity profile as the electron beam is scanned relative to the first aperture.

22. The system of claim 21, wherein the electron gun further comprises a filament array situated adjacent the cathode and configured to energize the ring-shaped electron-emission surface in a selective manner, the filament array comprising multiple filaments that are independently controllable to allow independent adjustment of electron current from the filaments to respective regions of the ring-shaped electron-emission surface.

23. An electron-beam microlithography apparatus, comprising the electron-beam optical system of claim 21.

24. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; (iii) developing the resist; and (iv) removing the resist; and step (ii) comprises providing an electron-beam microlithography system as recited in claim 23; and using the electron-beam microlithography system to expose the resist with the pattern defined on the reticle.

25. A semiconductor device produced by the method of claim 24.

26. In an electron-beam microlithography apparatus including, along an optical axis, an electron gun that produces an electron beam, an illumination-optical system that directs the electron beam to a reticle, and a projection-optical system that receives the electron beam from the reticle and directs the beam to a substrate, a method for detecting and adjusting a transverse beam-intensity profile of the electron beam, the method comprising the steps:

providing the electron gun with multiple filaments adjacent a cathode of the electron gun, each filament being connected to a respective power supply and a respective bombardment-voltage supply and being selectively energizable to adjust an output of electrons from a respective region of the cathode;

providing an off-axis aperture on a plane at a position at which an image of a beam crossover can be formed;

providing a detector situated relative to the aperture and a deflector situated upstream of the aperture;

energizing the deflector to cause the deflector to deflect the electron beam laterally to the aperture;

scanning the electron beam across the aperture;

using the detector, detecting electrons that have passed through the aperture so as to produce a data signal corresponding to a transverse beam-intensity profile of the electron beam; and based on data in the data signal, selectively adjusting electrical energy provided to at least some of the power supplies and bombardment-voltage supplies as required to cause a change to the transverse beam-intensity profile.

27. In an electron-beam microlithography method in which a hollow electron beam is passed through an illumination-optical system that directs the electron beam to a reticle, and the electron beam from the reticle is passed through a projection-optical system to a substrate, a method for evaluating a transverse beam-intensity profile of the hollow beam, the method comprising the steps:

providing an axial contrast aperture at an entrance pupil of the projection-optical system;

providing an off-axis aperture either at the entrance pupil or on a plane conjugate to the entrance pupil;

directing the hollow beam to the contrast aperture such that the beam at the contrast aperture has a central beam intensity that is less than a peripheral beam intensity;

scanning the hollow beam over the off-axis aperture; and while scanning the hollow beam over the off-axis aperture, detecting electrons of the beam passing through the off-axis aperture so as to obtain a transverse intensity profile of the beam.

28. In an electron-beam microlithography method in which a hollow electron beam is formed by an electron gun having multiple electrodes, passed through an illumination-optical system that directs the electron beam to a reticle, and passed through a projection-optical system to a substrate, a method for evaluating a transverse beam-intensity profile of the hollow beam, the method comprising the steps:

(a) providing a contrast aperture at an entrance pupil of the projection-optical system;

(b) providing an off-axis aperture either at the entrance pupil or on a plane conjugate to the entrance pupil;

(c) directing the hollow beam to the contrast aperture such that the beam at the contrast aperture has a central beam intensity that is less than a peripheral beam intensity, and the beam at the contrast aperture has a ring-shaped transverse section;

(d) scanning the hollow beam over the off-axis aperture;

(e) while scanning the hollow beam over the off-axis aperture, detecting electrons of the beam passing through the off-axis aperture so as to obtain a transverse intensity profile of the beam; and (f) adjusting the transverse intensity profile by adjusting electrical energy supplied to at least one of an electrode of the electron gun and a lens of the illumination-optical system.

29. The method of claim 28, wherein:

step (e) comprises obtaining a measurement of $I_{max}/h$, wherein $I_{max}$ is maximum beam intensity and h is a full width at half maximum of an intensity distribution of the beam; and step (f) is performed until $I_{max}/h$ is at a maximum.

30. The method of claim 28, wherein:

step (e) comprises obtaining a measurement of $I_{max}(\theta_{max})$ and $I_{max}(\theta_{min})$, wherein $I_{max}(\theta_{max})$ is a maximum beam intensity existing at a first location on the ring-shaped transverse section, and $I_{max}(\theta_{min})$ is a minimum beam intensity existing at a second location on the ring-shaped transverse section; and step (f) is performed until $I_{max}(\theta_{max})/I_{max}(\theta_{min})$ is at a minimum.

31. The method of claim 28, wherein:

the electron gun comprises a cathode having a ring-shaped electron-emission surface, and a filament array situated adjacent the cathode, the filament array comprising multiple filaments that are independently controllable to allow independent adjustment of electrical energy from the filaments to respective regions of the electron-emission surface; and step (f) comprises adjusting the electrical energy from the filaments to respective regions of the electron-emission surface.

32. A method for manufacturing a semiconductor device, comprising the steps:

(a) providing, along an optical axis, an electron gun that produces an electron beam, an illumination-optical system that directs the electron beam to a pattern-defining reticle, and a projection-optical system that receives the electron beam from the reticle and directs the beam to a substrate on which the device is to be formed;

(b) providing the electron gun with multiple filaments adjacent a cathode of the electron gun;

(c) connecting each filament to a respective power supply and a respective bombardment-voltage supply and selectively energizing the filaments using the respective power supplies and bombardment-voltage supplies;

(d) applying a resist layer to a wafer substrate;

(e) exposing the resist layer with the electron beam propagating from the electron gun, through the reticle, and through the projection-optical system to the substrate;

(f) processing the wafer; and (g) assembling devices formed on the wafer.

33. The method of claim 32, further comprising the step of adjusting a transverse beam-intensity profile of the electron beam emitted from the cathode by respectively setting each of the power supplies and bombardment-voltage supplies to adjust respective currents of electrons in the beam from respective regions of the cathode.

34. The method of claim 33, further comprising the steps of:

providing an off-axis aperture on a plane at a position at which either the illumination-optical system or the projection-optical system forms an image of a beam crossover;

providing a detector associated with the off-axis aperture and deflector situated upstream of the off-axis aperture;

scanning the electron beam across the off-axis aperture;

using the detector, detecting electrons that have passed through the off-axis aperture so as to produce a data signal corresponding to a transverse beam-intensity profile of the electron beam; and based on data in the data signal, selectively adjusting electrical energy provided to at least some of the power supplies and bombardment-voltage supplies as required to cause a change to the transverse-beam-intensity profile.

35. The method of claim 32, further comprising the step of operating the electron gun in a temperature-limited condition.

* * * * *

UNITED STATES PATENT AND TRADEMARK OFFICE
CERTIFICATE OF CORRECTION

PATENT NO.    : 6,538,255 B1    Page 1 of 1
DATED         : March 25, 2003
INVENTOR(S)   : Nakasuji It is certified that error appears in the above-identified patent and that said Letters Patent is hereby corrected as shown below:

<u>Column 8,</u>
Line 3, "relatively small aperture" should be -- relatively small aperture 25 --.

Signed and Sealed this

Fourth Day of November, 2003

JAMES E. ROGAN
*Director of the United States Patent and Trademark Office*